United States Patent
Hamner et al.

(10) Patent No.: US 8,033,852 B2
(45) Date of Patent: Oct. 11, 2011

(54) CONNECTOR ASSEMBLY FOR COUPLING CIRCUIT BOARDS

(75) Inventors: Richard Elof Hamner, Hummelstown, PA (US); Robert Neil Mulfinger, York Haven, PA (US); Jason M'Cheyne Reisinger, Carlisle, PA (US)

(73) Assignee: Tyco Electronics Corporation, Berwyn, PA (US)

(*) Notice: Subject to any disclaimer, the term of this patent is extended or adjusted under 35 U.S.C. 154(b) by 113 days.

(21) Appl. No.: 12/646,314

(22) Filed: Dec. 23, 2009

(65) Prior Publication Data
US 2011/0151685 A1 Jun. 23, 2011

(51) Int. Cl.
H01R 13/15 (2006.01)
(52) U.S. Cl. .................................................. 439/260
(58) Field of Classification Search ............ 439/260, 439/267, 65, 67
See application file for complete search history.

(56) References Cited

U.S. PATENT DOCUMENTS

| | | | |
|---|---|---|---|
| 3,636,499 A * | 1/1972 | Winkleblack | 439/260 |
| 4,085,990 A | 4/1978 | Jayne | |
| 4,261,631 A * | 4/1981 | Guilcher et al. | 439/260 |
| 4,480,569 A | 11/1984 | Van der Veen et al. | |
| 4,518,210 A | 5/1985 | Morrison | |
| 4,603,928 A | 8/1986 | Evans | |
| 4,626,056 A | 12/1986 | Andrews, Jr. et al. | |
| 4,629,270 A | 12/1986 | Andrews, Jr. et al. | |
| 4,731,698 A | 3/1988 | Millot et al. | |
| 4,840,569 A | 6/1989 | Cabourne | |
| 5,092,781 A | 3/1992 | Casciotti et al. | |
| 5,102,342 A | 4/1992 | Marian | |
| 5,171,154 A | 12/1992 | Casciotti et al. | |
| 5,205,739 A | 4/1993 | Malo et al. | |
| 5,228,863 A | 7/1993 | Campbell et al. | |
| 5,248,261 A | 9/1993 | Conroy-Wass et al. | |
| 6,062,872 A | 5/2000 | Strange et al. | |
| 6,077,090 A | 6/2000 | Campbell et al. | |
| 6,411,517 B1 | 6/2002 | Babin | |
| 6,672,878 B2 | 1/2004 | Dean | |
| 7,297,015 B1 | 11/2007 | Desrosiers et al. | |
| 7,374,441 B2 | 5/2008 | Rubenstein | |
| 7,419,400 B1 | 9/2008 | Taylor et al. | |
| 7,425,134 B1 | 9/2008 | Taylor | |
| 7,438,582 B2 * | 10/2008 | Taylor | 439/342 |
| 7,658,630 B2 * | 2/2010 | Tipley et al. | 439/260 |
| 2004/0229491 A1 * | 11/2004 | Maeda et al. | 439/260 |
| 2007/0097662 A1 | 5/2007 | Dean | |
| 2008/0227314 A1 | 9/2008 | Taylor | |

OTHER PUBLICATIONS

Neoconix PCBeam™ Interposer Design Guide, Neoconix, Rev. 070925, 4 pgs.

* cited by examiner

Primary Examiner — Gary F. Paumen

(57) ABSTRACT

A connector assembly includes a housing, a connector interface body, an elongated shaft, and a cam. The housing has an opening extending into the front face and an elongated channel oriented along the longitudinal axis. The cam is within the opening of the housing and includes a passageway through which a shaft of the housing extends. Rotation of the shaft rotates the cam to engage and drive the connector interface body away from the housing. The cam includes a collar protruding from the cam and extending along a periphery of the passageway. The collar has a clearance dimension along a first direction that is smaller than a gap between the retention features of the housing and an interference dimension along a transverse direction that is larger than the gap. The cam is retained in the housing when the collar engages retention features of the housing across the interference dimension.

20 Claims, 9 Drawing Sheets

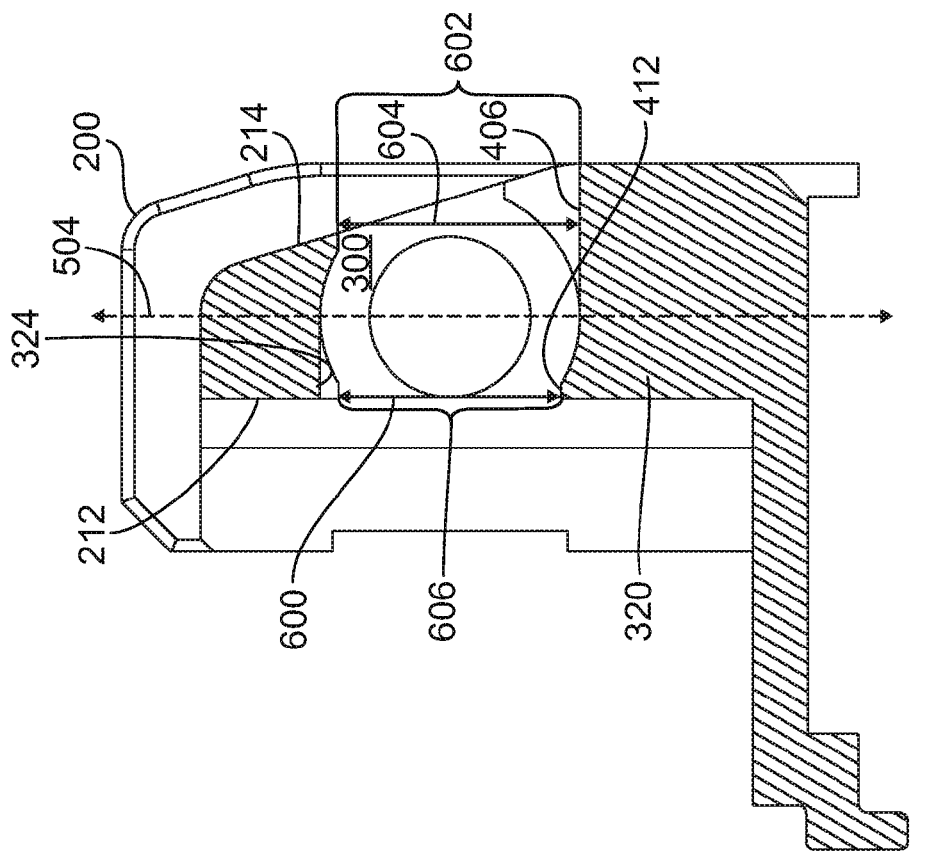
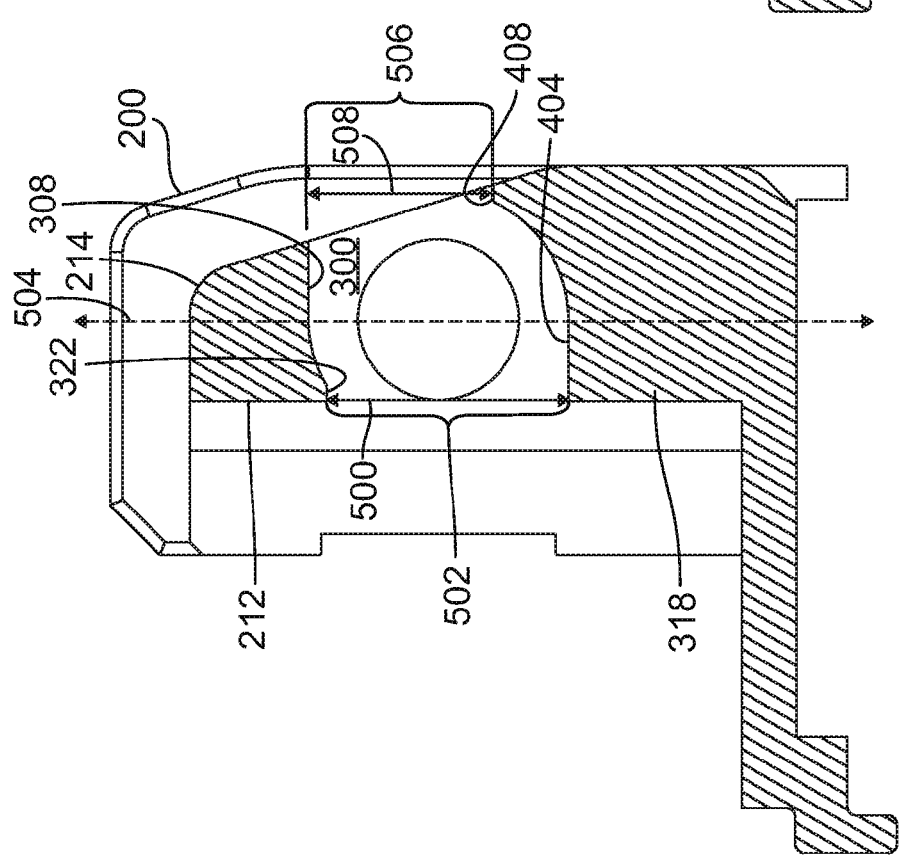

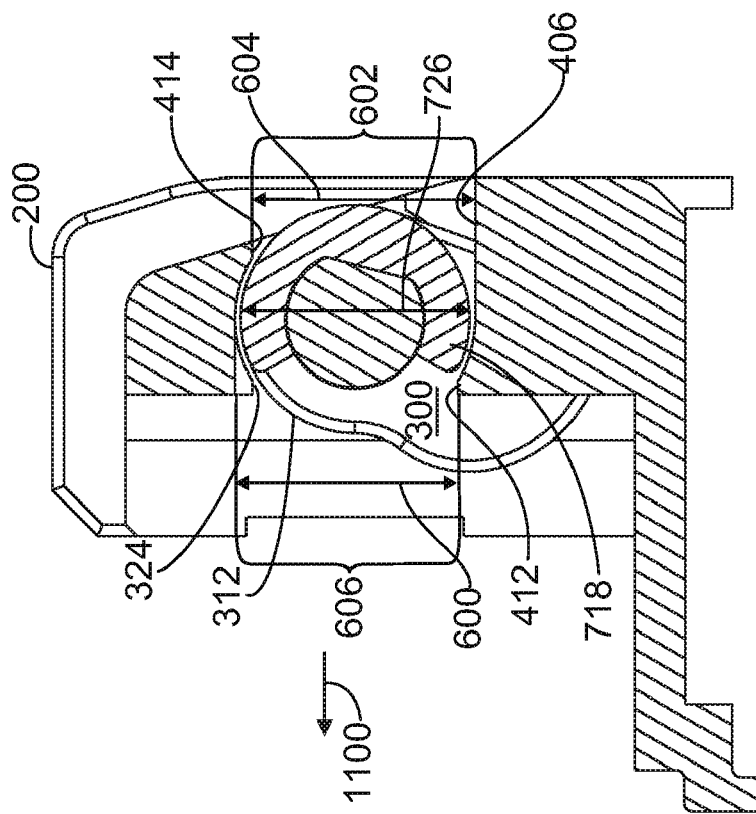
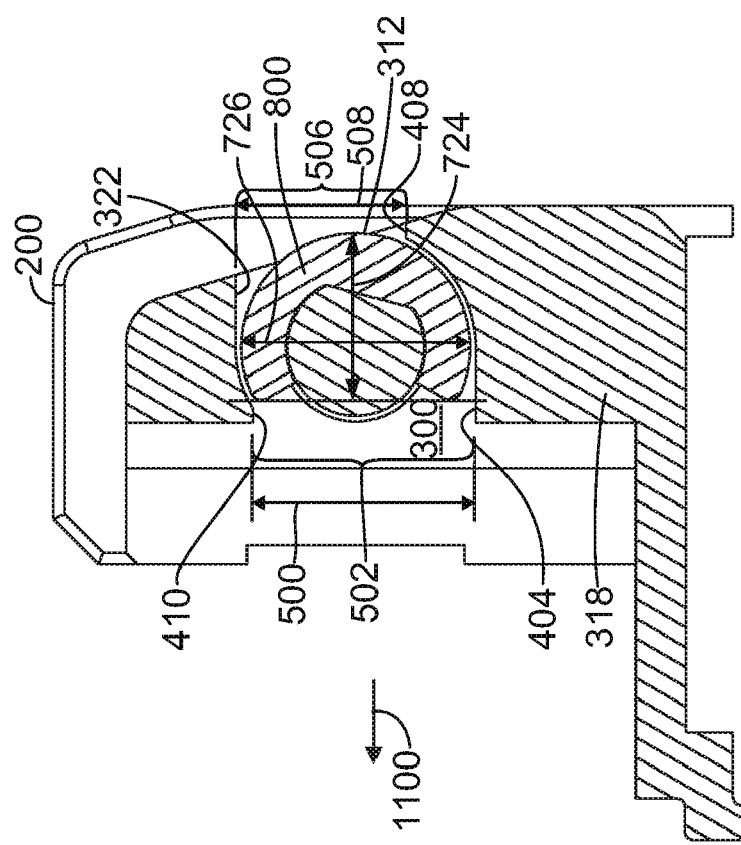

CONNECTOR ASSEMBLY FOR COUPLING CIRCUIT BOARDS

BACKGROUND OF THE INVENTION

The subject matter herein relates generally to electrical connectors and, more particularly, to electrical connectors that electrically couple circuit boards with one another.

Server systems may include several blade server circuit boards that are mounted to a backplane board. In some known server systems, the blade server circuit boards are loaded into a server box in a parallel relationship. For example, the blade server circuit boards are loaded into the server box through a front face of the box so that the blade server circuit boards are approximately parallel with respect to one another. Some known server systems include a motherboard located along a bottom side of the box. The motherboard includes connectors that mate with the blade server circuit boards such that the motherboard and blade circuit server boards are oriented perpendicular to one another. These connectors mate with the blade server circuit boards in directions that are perpendicular to the loading direction of the blade server circuit boards.

For example, the connectors may include a planar connector interface that moves away from the connector and toward a blade server circuit board. The connector interface includes contacts that mate with corresponding contacts on the blade server circuit board. The connector interface abuts against the blade server circuit board in order to mate the contacts with one another. In order to move the connector interface toward and away from the blade server circuit board, an elongated cam shaft that extends through the connector may be rotated. The cam shaft is coupled with cams in the connector that rotate with the cam shaft. As the cams rotate within the connector, the cams engage and drive the connector interfaces away from the connector housing and toward the blade server circuit board to couple with the circuit board.

But, the cams typically are affixed to the cam shafts using set screws and other types of fastening mechanisms. If the cam shaft needs to be replaced with a different cam shaft, replacement of the cam shaft requires an operator to separately detach the fastening mechanisms between the cams and the cam shafts before the cam shaft can be removed. The new cam shaft is placed into the connector and the operator must then re-attach the cams to the cam shaft. The requirement for repeated coupling and decoupling of the cams with the cam shafts may add significant time in replacing cam shafts in server systems that require the replacement of several cam shafts.

A need exists for a connector that couples circuit boards with one another using a cam shaft that may be more easily replaced with other cam shafts.

BRIEF DESCRIPTION OF THE INVENTION

In one embodiment, a connector assembly is provided. The connector assembly includes a housing, a connector interface body, an elongated shaft, and a cam. The housing extends between opposite ends along a longitudinal axis and includes a front face. The housing has an opening extending into the front face and an elongated channel oriented along the longitudinal axis. The housing also includes retention features extending into the opening. The connector interface body is joined with the front face of the housing and is configured to move away from the front face to mate with a circuit board. The elongated shaft is disposed in the channel and is configured to rotate within the housing. The cam is disposed within the opening of the housing and includes a passageway through which the shaft extends such that rotation of the shaft rotates the cam to engage and drive the connector interface body away from the housing. The cam includes a collar protruding from the cam and extending along a periphery of the passageway. The collar has a clearance dimension along a first direction that is smaller than a gap between the retention features of the housing and an interference dimension along a transverse direction that is larger than the gap. The cam is retained in the housing when the collar engages the retention features across the interference dimension.

In another embodiment, another connector assembly is provided. The connector assembly includes a housing, a connector interface body, an elongated shaft, and a cam. The housing extends between opposite ends along a longitudinal axis and includes a front face. The housing includes an opening extending into the front face and an elongated channel oriented along the longitudinal axis. The housing also includes retention elements disposed within the opening. The connector interface body is joined with the front face of the housing. The connector interface body is configured to move away from the front face to mate with a circuit board. The elongated shaft is disposed in the channel and is configured to rotate within the housing. The cam is disposed within the opening of the housing and includes a passageway through which the shaft extends such that rotation of the shaft rotates the cam to engage and drive the connector interface body away from the housing. The cam includes a collar protruding from the cam and extends along a periphery of the passageway. The collar has a clearance dimension along a first direction that is smaller than a height dimension of a gap between the retention features of the housing and an interference dimension along a transverse direction that is larger than the height dimension. The cam is configured to be retained in the housing when the shaft is removed from the channel by the cam engaging the retention features across the interference dimension of the collar.

BRIEF DESCRIPTION OF THE DRAWINGS

FIG. 5 is a cross-sectional view of the housing along line A-A in FIG. 4 in accordance with one embodiment of the present disclosure.

FIG. 6 is a cross-sectional view of the housing along line B-B in FIG. 4 in accordance with one embodiment of the present disclosure.

FIG. 11 is a cross-sectional view of the housing and the cam along line A-A shown in FIG. 4 when the cam is disposed in a disengaged position in accordance with one embodiment of the present disclosure.

FIG. 12 is a cross-sectional view of the housing and the cam taken along line B-B of FIG. 4 when the cam is disposed in the disengaged position shown in FIG. 11 in accordance with one embodiment of the present disclosure.

DETAILED DESCRIPTION OF THE INVENTION

Figure 1:
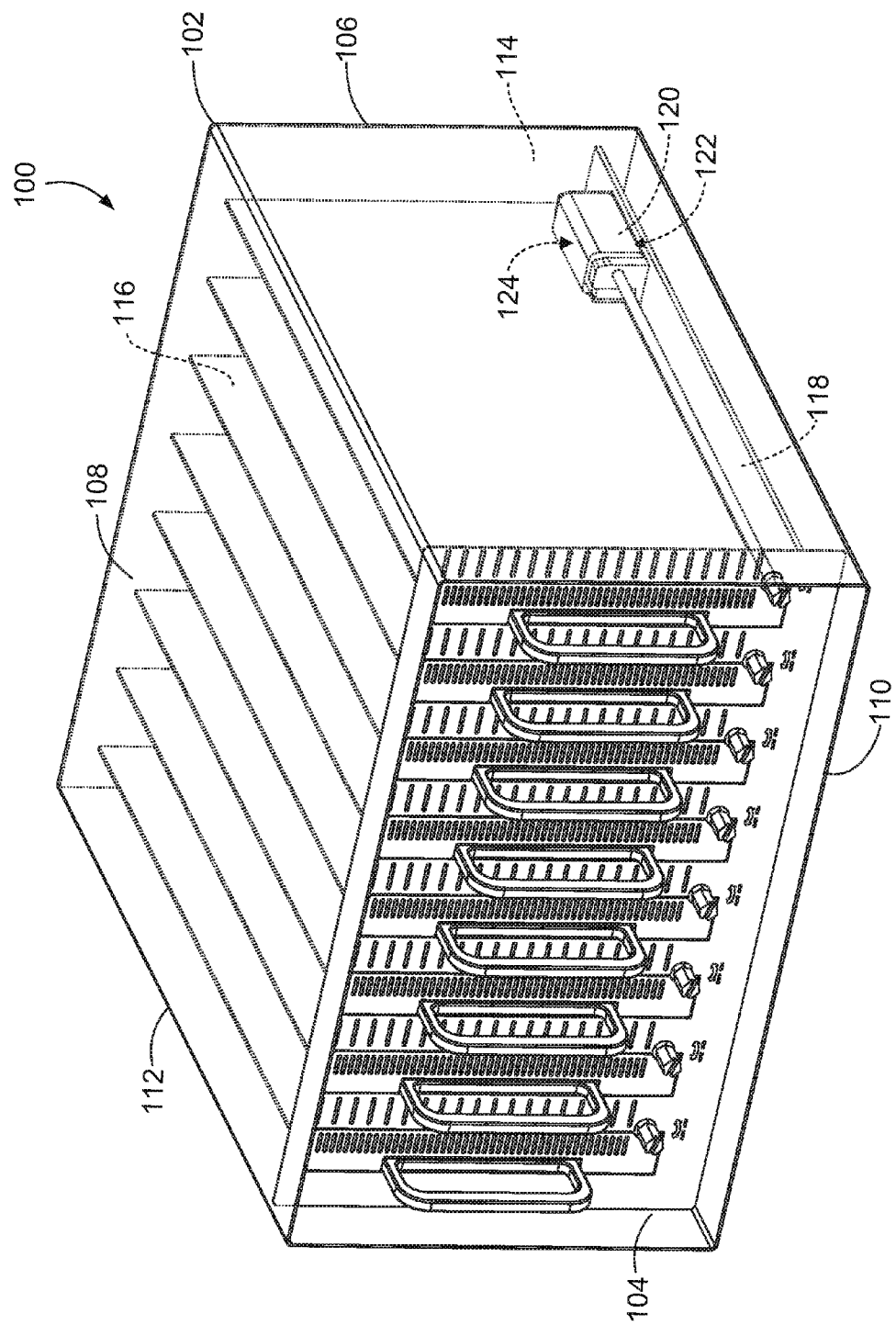
FIG. 1 is a perspective view of a circuit board system in accordance with one embodiment of the present disclosure.

FIG. 1 is a perspective view of a circuit board system 100 in accordance with one embodiment of the present disclosure. While the description provided herein focuses on a circuit board system that may be a server system, the embodiments described herein may be used in one or more other types of systems, such as rack-mount server systems, other non-server based systems, other connector systems that mate with circuit boards, and connector systems that mate with connectors other than circuit boards. The server system 100 includes a housing 102 that has opposite front and back faces 104, 106, opposite top and bottom faces 108, 110, and opposite side faces 112, 114. The housing 102 has a shape of a right rectangular prism, or a rectangular cuboid. For example, the opposite faces 104/106, 108/110, and 112/114 of the housing 102 may be approximately equal in size and the angles between intersecting faces may be approximately perpendicular. Alternatively, the housing 102 may have a different shape.

Several removable circuit boards 116 may be loaded into and removed from the housing 102 through the front face 104. For example, the front face 104 may be open such that the circuit boards 116 may be inserted into and removed from the housing 102 through the front face 104. In the illustrated embodiment, the circuit boards 116 are blade server boards held in a parallel relationship with respect to one another within the housing 102. For example, the removable circuit boards 116 are oriented approximately parallel to one another within the housing 102. The removable circuit boards 116 are capable of being loaded into and removed from the housing 102 multiple times without damaging or otherwise deconstructing the system 100. Each of the removable circuit boards 116 may be a printed circuit board having one or more electronic components (not shown) mounted thereon. The electronic components may include, by way of example only, hard drives, power supplies, network connectors, input/output devices and connectors, integrated circuits and processors, and the like. The circuit boards 116 include contacts 124 disposed on or at one or more of opposite surfaces of the circuit boards 116.

A mother circuit board, or motherboard, 118 is disposed within the housing 102 in a location proximate to the bottom face 110. For example, the motherboard 118 may be located in the housing 102 in a position that is approximately parallel to the bottom face 110 and that is closer to the bottom face 110 than the top face 108. In the illustrated embodiment, the motherboard 118 is disposed in a non-parallel relationship with respect to the removable circuit boards 116. For example, the motherboard 118 may be approximately perpendicular with respect to the removable circuit boards 116. The motherboard 118 includes contacts 122 disposed on an upper surface of the motherboard 118.

Several connector assemblies 120 are mounted to the motherboard 118. The connector assemblies 120 are electrically coupled with the motherboard 118 and may couple and decouple with one or more of the removable circuit boards 116 to alternatively electrically couple and decouple the removable circuit boards 116 with the motherboard 118. For example, the connector assemblies 120 may include contacts (not shown) that mate with the contacts 122 of the motherboard 118 to electrically couple the connector assemblies 120 with the motherboard 118. As described below, the connector assemblies 120 include contacts 218 (shown in FIG. 2) that couple with the contacts 124 of the removable circuit boards 116 to electrically couple the connector assemblies 120 with the circuit boards 116.

In one embodiment, a single connector assembly 120 may be mounted to the motherboard 118 for each of the circuit boards 116 that is mated to the motherboard 118. For example, each connector assembly 120 may mate with a single removable circuit board 116. Alternatively, several connector assemblies 120 may be mounted to the motherboard 118 for each of the circuit boards 116. For example, two or more connector assemblies 120 may mate with a removable circuit board 116. In another embodiment, a single connector assembly 120 may be mounted to the motherboard 118 for two or more of the circuit boards 116. For example, a single connector assembly 120 may mate with two or more circuit boards 116. Alternatively, the connector assembly 120 may be mounted to a circuit board 116 and mate with the motherboard 118. A combination of the connector assemblies 120 may be disposed within the housing 102. By way of example only, some connector assemblies 120 may mate with a single circuit board 116, other connector assemblies 120 may mate with multiple circuit boards 116, and some groups of connector assemblies 120 may mate with a singe circuit board 116.

Data signals and/or electric power may be communicated between the circuit boards 116 and the motherboard 118 via one or more of the connector assemblies 120. The housing 102 may permit air to flow through the housing 102 from the front face 104 to the back face 106, and vice-versa. The connector assemblies 120 may be mounted to the motherboard 118 to avoid significantly restricting the airflow through the housing 102. As shown in FIG. 1, the connector assemblies 120 comprise a relatively low height profile above the motherboard 118. For example, the connector assemblies 120 do not significantly project from the motherboard 118 with the result that the connector assemblies 120 do not substantially impede airflow across the surface of the motherboard 118.

Figure 2:
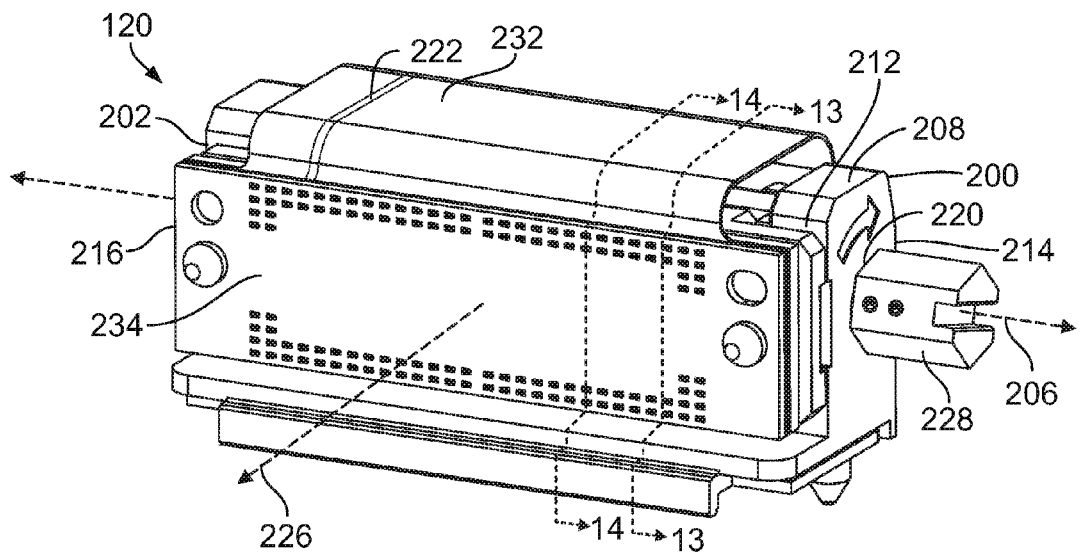
FIG. 2 is a perspective view of a connector assembly shown in FIG. 1 in accordance with one embodiment of the present disclosure.

FIG. 2 is a perspective view of the connector assembly 120 in accordance with one embodiment of the present disclosure. The connector assembly 120 includes a housing 200 that is elongated between opposite ends 202, 204 along a longitudinal axis 206. The housing 200 includes a top side 208 disposed opposite of a mounting side 210, and a front face 212 oriented opposite of a back side 214. In the illustrated embodiment, the longitudinal axis 206 extends through a region bounded by the top side 208, the mounting side 210, the front face 212, and the back side 214.

A connector interface body 216 is joined with the front face 212 of the housing 200. The connector interface body 216 shown in FIG. 2 is an approximately planar body with several contacts 218 disposed thereon. The contacts 218 mate with the contacts 124 (shown in FIG. 1) on the removable circuit board 116 (shown in FIG. 1). The mounting side 210 of the housing 200 includes contacts (not shown) that are electrically coupled with the motherboard 118 (shown in FIG. 1) when the housing 200 is mounted to the motherboard 118. The contacts on the mounting side 210 are electrically joined with the contacts 218 on the connector interface body 216 via a circuit member 232. The circuit member 232 may be a flexible circuit board that extends from the front face 212 of the housing 200, across the top side 208 and the back side 214 to the mounting side 210. The circuit member 232 may include conductive traces 222 that electrically couple the contacts 218 with the contacts on the mounting side 210. The mating of the contacts 218 with the circuit board 116 electrically couples the circuit board 116 with the motherboard 118 (shown in FIG. 1). For example, when the contacts 218 mate with the contacts 124 (shown in FIG. 1) of the circuit board 116 and the contacts on the mounting side 210 mate with the contacts 122 (shown in FIG. 1) of the motherboard 118, the contacts 124 of the circuit board 116 are electrically joined with the contacts 122 of the motherboard 118.

In the illustrated embodiment, the connector interface body 216 includes a mating face 234 that defines a two-dimensional plane oriented approximately parallel to the front face 212. The connector interface body 216 and mating face 234 move relative to the housing 200 to couple with the removable circuit board 116 (shown in FIG. 1) to which the connector assembly 120 mates. For example, the connector interface body 216 may move linearly away from the front face 212 of the housing 200 in a mating direction 226 to mate the mating face 234 with the circuit board 116. Prior to mating the mating face 234 with the removable circuit board 116, the mating face 234 may be spatially separated from the circuit board 116. The connector interface body 216 and mating face 234 moves away from the housing 200 along or parallel to the mating direction 226 to engage the mating face 234 with the circuit board 116 and couple with the circuit board 116.

In the illustrated embodiment, the housing 200 includes an elongated channel 220 that extends through the housing 200 from one end 204 to the opposite end 202. The channel 220 is oriented along the longitudinal axis 206. An elongated shaft 228 is held in the channel 220 and protrudes from at least one of the ends 202, 204. The shaft 228 may be rotated within the channel 220 relative to the housing 200. As described below, rotation of the shaft 228 rotates cams 312 (shown in FIG. 3) disposed within the housing 200 and causes the cams 312 to engage the connector interface body 216 and drive the connector interface body 216 in the mating direction 226 to couple the connector interface body 216 with the circuit board 116. The shaft 228 may be rotated in an opposite direction to move the connector interface body 216 away from the circuit board 116 to decouple the mating face 234 of the connector interface body 216 from the circuit board 116.

The shaft 228 may be removed from the housing 200 and replaced with a different shaft 228 without separately decoupling the cams 312 (shown in FIG. 3) from the shaft 228. For example, the shaft 228 may be removed from the channel 220 by pulling the shaft 228 out of the housing 200 along the longitudinal axis 206. The removal of the shaft 228 in this way does not require the cams 312 to be separately removed from the shaft 228 prior to removing the shaft 228 from the housing 200. As described below, the cams 312 engage the housing 200 and secure themselves within the housing 200. A different shaft 228 may be loaded into the channel 220 along the longitudinal axis 206. For example, a longer shaft 228 that may extend through multiple housings 200 with channels 220 that are axially aligned with one another may be loaded into the channels 220 of the housings 200. The longer shaft 228 may be rotated to concurrently or simultaneously move the connector interfaces 216 of the multiple housings 200 in corresponding mating directions 226. The longer shaft 228 may be placed into the housing 200 and is automatically coupled with the cams 312 as the shaft 228 is placed into the channel 220 without requiring additional steps or actions to affix the cams 312 to the longer shaft 228.

Figure 3:
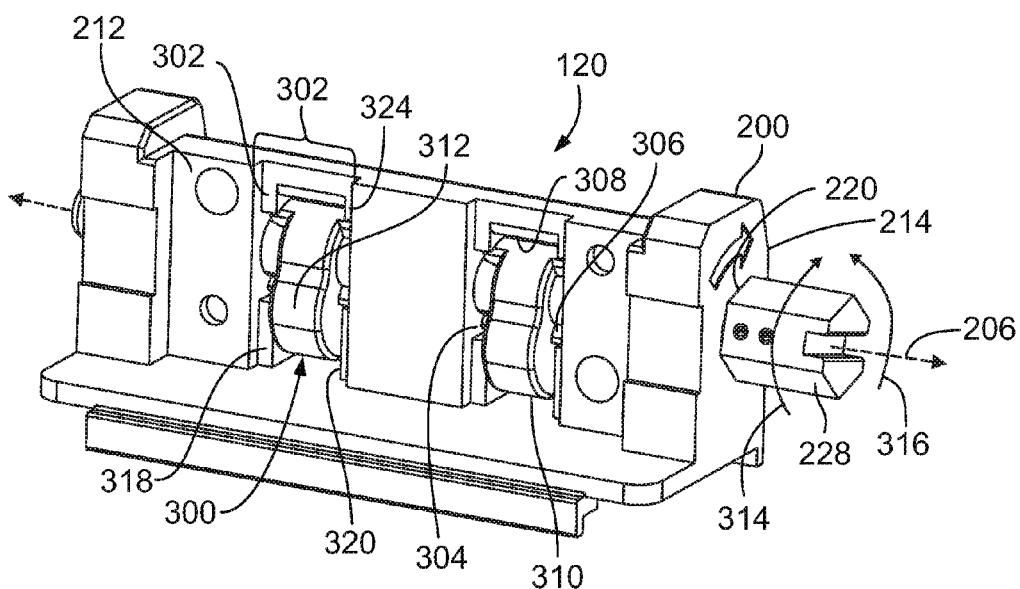
FIG. 3 is a perspective view of the connector assembly shown in FIG. 1 with a connector interface shown in FIG. 2 removed in accordance with one embodiment of the present disclosure.

FIG. 3 is a perspective view of the connector assembly 120 with the connector interface body 216 (shown in FIG. 2) removed in accordance with one embodiment of the present disclosure. The housing 200 of the connector assembly 120 includes openings 300 that extend into the front face 212 of the housing 200. In the illustrated embodiment, the front face 212 includes recessed portions 302, with the openings 300 disposed in the recessed portions 302. The housing 200 shown in FIG. 3 includes two openings 300, although a single or three or more openings 300 may be provided. The openings 300 may extend through the housing 200 from the front face 212 to the back side 214 or may only partially extend into the housing 200 from the front face 212 toward the back side 214. The openings 300 are framed by several internal surfaces 304, 306, 308, 310 of the housing 200. For example, each opening 300 may be enclosed on four sides by opposing internal side surfaces 304, 306 and opposing internal upper and lower surfaces 308, 310.

The cams 312 are received in the openings 300. The cams 312 are joined with the shaft 228 such that rotation of the shaft 228 moves the cams 312 relative to the housing 200. The channel 220 in which the shaft 228 is located may extend through the openings 300. For example, the channel 200 may intersect the openings 300 such that the shaft 228 passes through the openings 300 in directions along the longitudinal axis 206.

As shown in FIG. 3, the shaft 228 is joined with the cams 312 in the openings 300. The shaft 228 is rotated within the channel 200 to rotate the cams 312 and to at least partially move the cams 312 out of the openings 300 through the front face 212. For example, the shaft 228 may be rotated about the longitudinal axis 206 in a mating direction 314 to rotate the cams 312 within the openings 300. The rotation of the cams 312 may cause the cams 312 to at least partially extend out of the openings 300 through the front face 212. The movement of the cams 312 out of the front face 212 may cause the cams 312 to engage the connector interface body 216 (shown in FIG. 2). Continued movement of the cams 312 causes the cams 312 to move the connector interface body 216 away from the front face 212 of the housing 200. The shaft 228 may be rotated about the longitudinal axis 206 in a disengaged direction 316 to rotate the cams 312 back into the openings 300 such that the cams 312 recede into the front face 212 to the positions shown in FIG. 3. In one embodiment, movement of the cams 312 back into the openings 300 causes the cams 312 to no longer drive the connector interface body 216 away from the housing 200. Instead, the connector interface body 216 may move back toward the front face 212.

The housing 200 includes retention features 318, 320, 322, 324 that extend toward one another in the openings 300. In the illustrated embodiment, the retention features 318, 320, 322, 324 are ledges that inwardly extend into each opening 300. The retention features 318, 320 protrude toward each another and the retention features 322, 324 protrude toward each other. For example, in the openings 300 shown in FIG. 3, the retention features 318, 322 project from the internal side surfaces 304 toward the internal side surfaces 306 and the retention features 320, 324 project from the internal side surfaces 306 toward the internal side surfaces 304. The retention features 318, 322 may be referred to as one set of retention features while the retention features 320, 324 may be referred to as another set of retention features. As described below, the cams 312 engage the retention features 318, 320, 322, 324 to secure the cams 312 within the openings 300 and prevent inadvertent removal of the cams 312 from the openings 300 when the shaft 228 is pulled from the housing 200 along the longitudinal axis 206.

Figure 4:
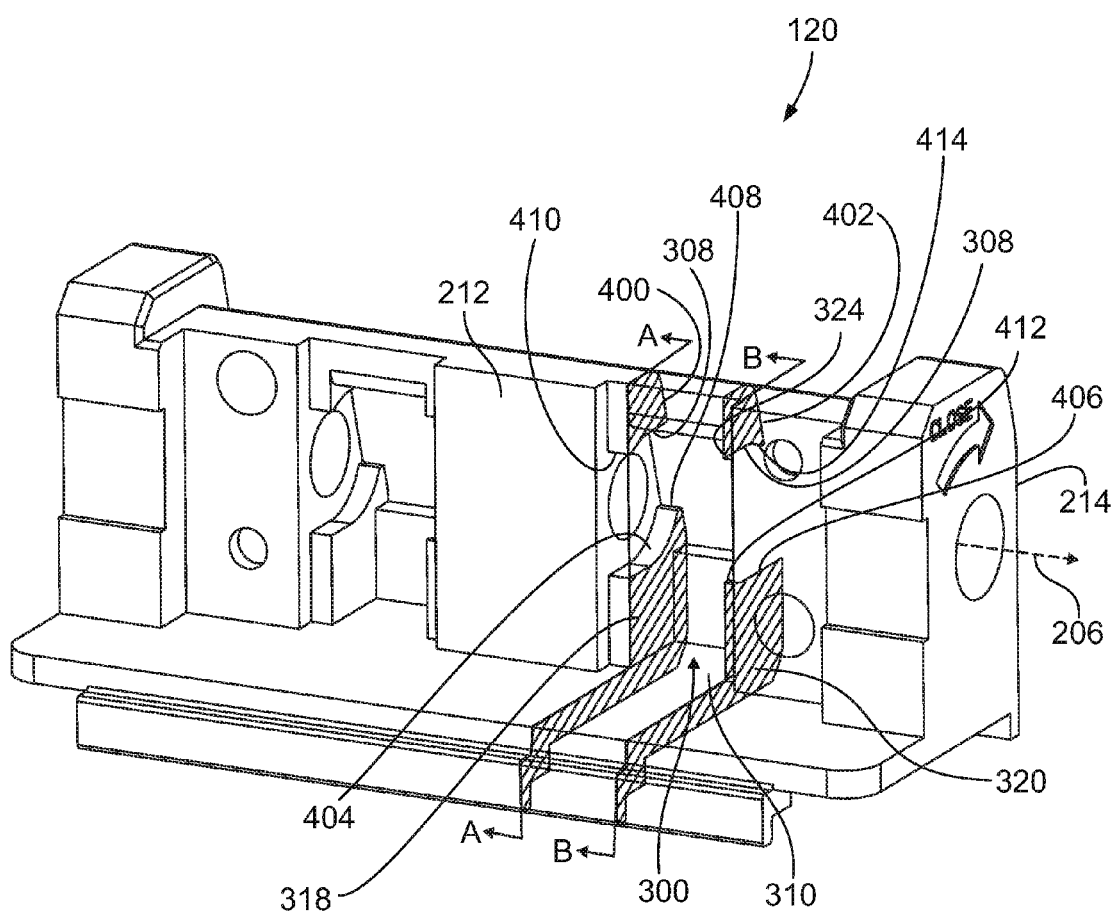
FIG. 4 is a perspective view of a housing shown in FIG. 2 in accordance with one embodiment of the present disclosure.

FIG. 4 is a perspective view of the connector assembly 120 in accordance with one embodiment of the present disclosure. FIG. 4 includes phantom lines 400, 402 that show two cross-sections of the housing 200. The cross-sectional views represented by the phantom lines 400, 402 are shown in FIGS. 5 and 6, respectively. The retention features 318, 320 and the retention features 322, 324 extend into the opening 300 toward one another in opposing directions that are oriented parallel to the longitudinal axis 206. The retention feature 318 includes a resting surface 404 and the retention feature 320 includes a resting surface 406. The resting surfaces 404, 406 oppose the internal upper surface 308 of the housing 200. The resting surfaces 404, 406 disposed in each of the openings 300 form ledges upon which the cam 312 (shown in FIG. 3) in the opening 300 engages. For example, the cam 312 may be supported by the resting surfaces 404, 406 such that the cam 312 is held above the lower internal surface 310 of the housing 300.

In the illustrated embodiment, the resting surfaces 404, 406 extend between and intersect each of the front face 212 and the back side 214 of the housing 200. Alternatively, the resting surfaces 404, 406 may engage only one of the front face 212 and the back side 214 or neither of the front face 212 and the back side 214. The resting surface 404 shown in FIG. 4 has a concave shape or surface that extends up to and terminates at a retention lip 408. Alternatively, the resting surface 404 may have a different shape. The retention lip 408 is a peak or apex of the resting surface 404 that protrudes upward from the resting surface 404. The retention lip 408 upwardly projects from the resting surface 404 toward the internal upper surface 308 in a direction that is approximately perpendicular to the longitudinal axis 206. The retention lip 408 may be located at or near the intersection of the resting surface 404 and the back side 214 of the housing 200. Alternatively, the retention lip 408 may be located at or near the intersection of the resting surface 404 and the front face 212 or between the front face 212 and the back side 214.

The retention features 322, 324 include the internal upper surface 308 in the illustrated embodiment. The retention features 322, 324 oppose the resting surfaces 404 and have a concave shape or surface that extends downward and terminates at a retention lip 410. Alternatively, the retention features 322, 324 may have a different shape. The retention lip 410 is a lower vertex or nadir of the section of the retention feature 322 that opposes the resting surface 404, or that is located directly above the resting surface 404 in a direction that is perpendicular to the longitudinal axis 206. In contrast to the retention lip 408 of the opposing resting surface 404, the retention lip 410 of the retention feature 322 downwardly projects from the upper surface 308 toward the resting surface 404 in a direction that is approximately perpendicular to the longitudinal axis 206. The retention lip 410 is located at the intersection of the front face 212 and the internal upper surface 308 in the illustrated embodiment. Alternatively, the retention lip 410 may be located elsewhere, such as at the intersection of the back side 214 and the internal upper surface 308 or between the front face 212 and the back side 214.

The resting surface 406 shown in FIG. 4 is approximately flat with a retention lip 412 that upwardly extends from the resting surface 406. Alternatively, the resting surface 406 may have a different shape. The retention lip 412 is a peak or apex of the resting surface 406 that protrudes upward from the resting surface 406 toward the retention feature 324 in a direction that is approximately perpendicular to the longitudinal axis 206. The retention lip 412 may be located at the intersection of the resting surface 406 and the front face 212 of the housing 200. Alternatively, the retention lip 412 may be located at or near the intersection of the resting surface 404 and the back side 214 or between the front face 212 and the back side 214.

The section of the retention feature 324 that is disposed above, or opposes, the resting surface 406 has a concave shape or surface that extends downward and terminates at a retention lip 414. The retention lip 414 is a lower vertex or nadir of the section of the retention feature 324 that opposes the resting surface 406, or that is located directly above the resting surface 406 in a direction that is perpendicular to the longitudinal axis 206. The retention lip 414 downwardly projects from the retention feature 324 toward the resting surface 406 in a direction that is approximately perpendicular to the longitudinal axis 206. The retention lip 414 is located at the intersection of the back side 214 and the retention feature 324 in the illustrated embodiment. Alternatively, the retention lip 414 may be located elsewhere, such as at the intersection of the front face 212 and the retention feature 324 or between the front face 212 and the back side 214.

FIG. 5 is a cross-sectional view of the housing 200 along line A-A in FIG. 4 in accordance with one embodiment of the present disclosure. The opening 300 in the housing 200 includes a front gap 502 that extends between the resting surface 404 of the retention feature 318 and the retention feature 322 at the front face 212 of the housing 200. The front gap 502 represents an entryway or passage that provides access into the opening 300 from outside of the housing 200 through the front face 212. In the illustrated embodiment, the front gap 502 extends between the retention lip 410 of the retention feature 322 and the resting surface 404 of the retention feature 318. A height dimension 500 of the front gap 502 represents the distance between the retention lip 410 and the resting surface 404 in a direction that is parallel to a vertical axis 504 of the housing 200. The vertical axis 504 is oriented perpendicular to the longitudinal axis 206 (shown in FIG. 2) of the housing 200.

The opening 300 includes a rear gap 506 in the illustrated embodiment. The rear gap 506 extends between the resting surface 404 and the retention feature 322 at the back side 214 of the housing 200. The rear gap 506 represents an entryway or passage that provides access into the opening 300 from outside of the housing through the back side 214. In the illustrated embodiment, the rear gap 506 extends between the retention lip 408 of the resting surface 404 and the retention feature 322. A height dimension 508 of the rear gap 506 represents the distance between the retention feature 322 and the retention lip 408 in a direction that is parallel to the vertical axis 504.

FIG. 6 is a cross-sectional view of the housing 200 along line B-B in FIG. 4 in accordance with one embodiment of the present disclosure. As shown in FIG. 6, a front gap 606 of the opening 300 extends between the resting surface 406 of the retention feature 320 and the retention feature 324 at the front face 212 of the housing 200. The front gap 606 represents an entryway or passage that provides access into the opening 300 from outside of the housing 200 through the In the illustrated embodiment, the front gap 606 extends between the retention lip 412 of the resting surface 406 and the retention feature 324. The retention lip 412 and the retention feature 324 are separated by, and the front gap 606 is defined by, a height dimension 600 in a direction that is parallel to the vertical axis 504. The height dimension 600 may be the same, or approximately the same, as the height dimension 500 (shown in FIG. 5). Alternatively, the height dimensions 500, 600 may differ from one another.

A rear gap 602 is an opening that extends between the resting surface 406 and the retention feature 324 at the back side 214 of the housing 200. The rear gap 602 represents an entryway or passage into the opening 300 through the back side 214 between the resting surface 406 and the retention feature 324. The resting surface 406 and the retention feature 324 are separated by, and the rear gap 602 is defined by, a height dimension 604. The height dimension 604 is measured in a direction that is parallel to the vertical axis 504.

Figure 7:
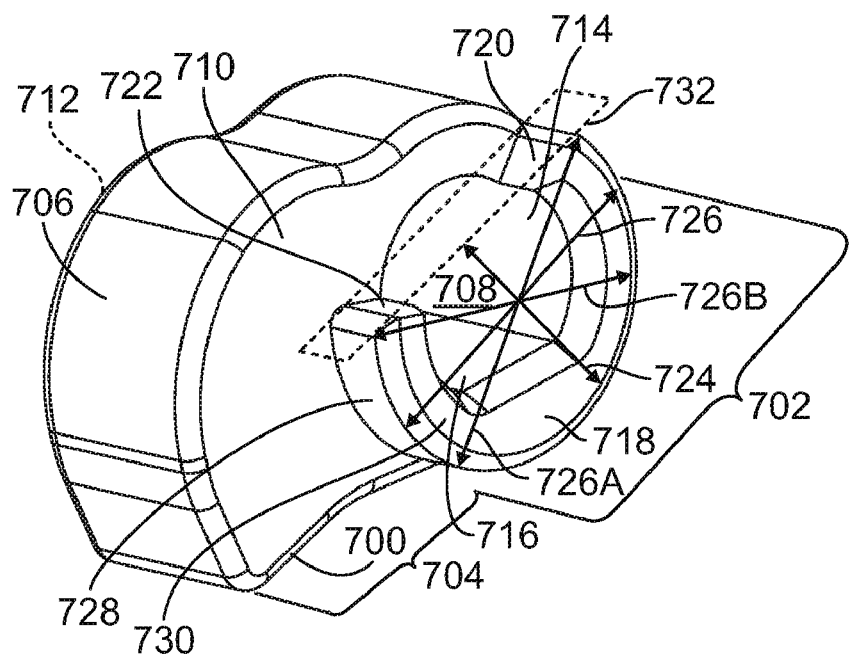
FIG. 7 is a perspective view of a cam shown in FIG. 3 in accordance with one embodiment of the present disclosure.
Figure 8:
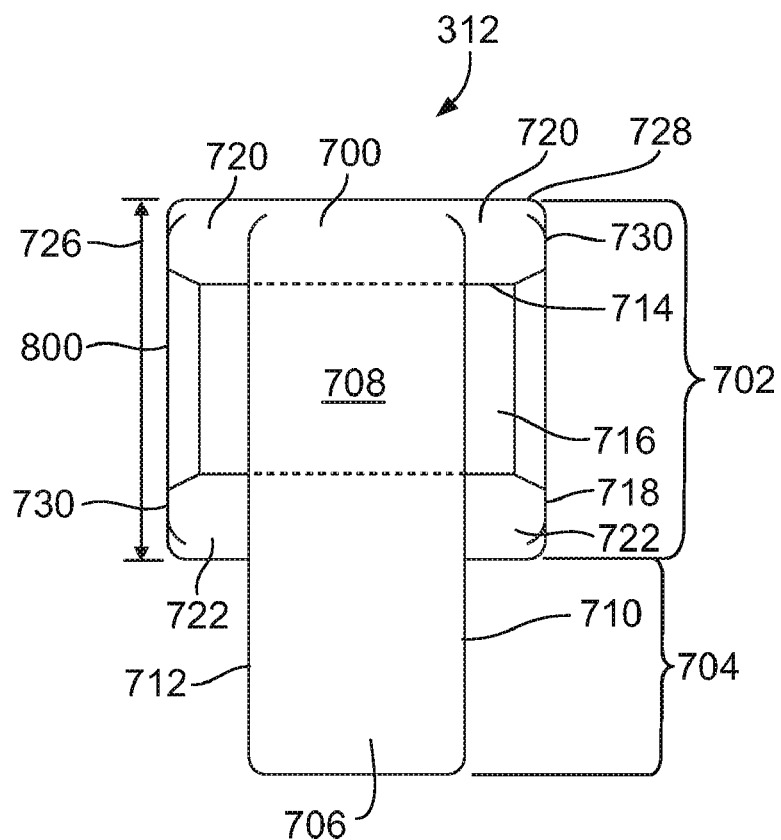
FIG. 8 is a plan view of the cam in accordance with one embodiment of the present disclosure.

FIG. 7 is a perspective view of the cam 312 in accordance with one embodiment of the present disclosure. FIG. 8 is a plan view of the cam 312 in accordance with one embodiment of the present disclosure. The cam 312 includes an oblong body 700 that has an approximate shape of the letter "B." Alternatively, the cam 312 may have a different shape, such as that of an oval, a circle with an off-center axis, an ellipsoid, an elongated cuboid, and the like. The body 700 extends between opposite sides 710, 712. An upper portion 702 of the cam 312 includes approximately one-half of the body 700 and a lower portion 704 includes the remainder of the body 700. The lower portion 704 includes an engagement surface 706. The upper portion 702 includes a passageway 708 that receives the shaft 228 (shown in FIG. 2). For example, the passageway 708 may be axially aligned with the channel 220 (shown in FIG. 2) of the housing 200 so that the shaft 228 may extend through the channel 220 and the passageway 708. As shown in FIG. 7, the passageway 708 is off-center of the body 700 in the illustrated embodiment. An interior surface 714 of the body 700 that extends along the passageway 708 inside the cam 312 may engage the shaft 228. The interior surface 714 may include an approximately flat portion 716 that functions as a keying feature for the cam 312. For example, the shaft 228 may include a flat portion that abuts the flat portion 716 of the cam 312 in order to couple the shaft 228 with the cam 312. The coupling of the cam 312 to the shaft 228 causes the cam 312 to rotate along with the shaft 228. For example, the shaft 228 may be rotated in the mating direction 314 (shown in FIG. 3) to rotate the lower portion 704 of the cam 312 toward the connector interface body 216 (shown in FIG. 2). Rotation of the lower portion 704 toward the connector interface body 216 causes the engagement surface 706 to contact the connector interface body 216 and drive the connector interface body 216 away from the housing 200 (shown in FIG. 2).

The cam 312 includes collars 718, 800 (shown in FIG. 8) that protrude in opposite directions from the sides 710, 712. In another embodiment, the cam 312 may include a single collar 718, 800. The collars 718, 800 may be semi-circular projections that partially extend around the periphery of the passageway 708 on the opposite sides 710, 712. For example, the collars 718, 800 do not form complete circles. Instead, the collars 718, 800 are semi-circular shapes. In the illustrated embodiment, the collars 718, 800 are formed as arcs or open circles that extend between opposite ends 720, 722 around a portion, but not all, of the periphery of the passageway 708 on each side 710, 712. Alternatively, the ends 720, 722 may be joined with one another by, for example, a straight edge or bar. The collars 718, 800 may have a different semi-circular shape, such as the approximate shape of an oval, an ellipse, and the like. In another embodiment, the collars 718, 800 have a non-circular shape, such as a square, rectangle, and the like. The collars 718, 800 may have different shapes relative to one another. The collars 718, 800 have exterior surfaces 728 that extend from the sides 710, 712 in approximately perpendicular directions from the sides 710, 712. The exterior surfaces 728 extend from the sides 710, 712 to outer surfaces 730. In the illustrated embodiment, the outer surface 730 of the collar 718 is approximately parallel to the side 710 and the outer surface 730 of the collar 800 is approximately parallel to the side 712.

Each of the collars 718, 800 illustrated in FIGS. 7 and 8 has a clearance dimension 724 (shown in FIG. 7) that extends across the collars 718, 800 in a first direction and an interference dimension 726 that extends across the collars 718, 800 in a transverse direction. For example, the clearance dimension 724 and interference dimension 726 are measured along directions that lie across one another and are not parallel to each other. The clearance dimension 724 may be measured in a direction that is oriented at an oblique or perpendicular angle with respect to the direction in which the interference dimension 726 is measured.

In the illustrated embodiment, the clearance dimension 724 of each collar 718, 800 crosses or extends across the collar 718, 800 only a single time. For example, the clearance dimension 724 of each collar 718, 800 shown in the illustrated embodiment may be measured between the exterior surface 728 and a plane 732 that extends through the ends 720, 722 of the collar 718, 800. The interference dimension 726 of each collar 718, 800 extends across or crosses the collar 718, 800 twice in the illustrated embodiment. For example, the interference dimension 726 may be measured between the exterior surface 728 on one side of each collar 718, 800 and the exterior surface 728 on an opposite side of the collar 718, 800. Several other interference dimensions 726A, 726B are shown in FIG. 7 to illustrate that the interference dimension 726 extends across each collar 718, 800 twice. As shown in FIG. 7, the interference dimension 726 is greater than the clearance dimension 724. As described below, the relative sizes of the clearance and interference dimensions 724, 726 permit the cams 312 to be loaded into the openings 300 (shown in FIG. 3) of the connector assembly 120 (shown in FIG. 1) when the cams 312 are oriented in a first position, but prevent the cams 312 from being removed from the openings 300 when the cams 312 are oriented or rotated to a second, different position relative to the connector assembly 120.

Figure 9:
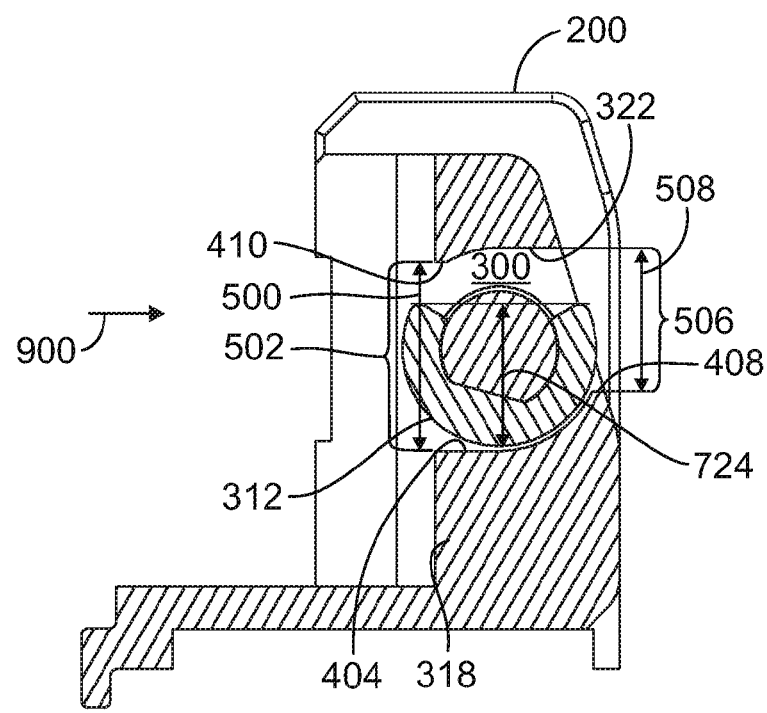
FIG. 9 is a cross-sectional view of the housing and the cam along line A-A shown in FIG. 4 when the cam is disposed in an engaged position in accordance with one embodiment of the present disclosure.

FIG. 9 is a cross-sectional view of the housing 200 and the cam 312 along line A-A shown in FIG. 4 when the cam 312 is disposed in an engaged position in accordance with one embodiment of the present disclosure. The cross-sectional view shown in FIG. 9 illustrates the interaction between the housing 200 and the collar 800 of the cam 312. The position of the cam 312 shown in FIG. 9 is the position in which the cam 312 may be loaded into the opening 300 of the housing 200 between the retention feature 322 and the resting surface 404 of the retention feature 318. The illustrated position also may be referred to as the engaged position as this is the same position in which the cam 312 may be rotated within the housing 200 in order to rotate the engagement surface 706 (shown in FIG. 7) toward the connector interface body 216 (shown in FIG. 2) to engage the connector interface body 216 and drive the connector interface body 216 away from the housing 200.

As shown in FIG. 9, the clearance dimension 724 of the collar 800 is smaller than the height dimension 500 of the front gap 502 of the housing 200. The collar 800 may be oriented in the position shown in FIG. 9 such that the clearance dimension 724 is aligned with the front gap 502. For example, prior to loading the cam 312 into the opening 300 through the front gap 502, the cam 312 may be rotated or positioned relative to the housing 200 such that the clearance dimension 724 is approximately parallel to the direction in which the height dimension 500 is measured. By "approximate," it is intended to encompass scenarios where the clearance dimension 724 is not parallel to the direction in which the height dimension 500 is measured, but is oriented such that the collar 800 may be loaded into the front gap 502.

The cam 312 may be loaded into the opening 300 in a loading direction 900 when the collar 800 is aligned with the front gap 502 and the clearance dimension 724 is approximately parallel to the direction in which the height dimension 500 is measured. The cam 312 may be loaded into the opening 300 in the loading direction 900 because the clearance dimension 724 is smaller than the height dimension 500 of the front gap 502 and the collar 800 does not engage the retention feature 322, the retention lip 410, or the resting surface 404 of the retention feature 318. Alternatively, the cam 312 may be loaded into the opening 300 in an opposite loading direction through the rear gap 506 when the collar 800 is aligned with the rear gap 506 and the clearance dimension 724 is approximately parallel to the direction in which the height dimension 508 is measured. The clearance dimension 724 may be smaller than the height dimension 508 to permit the loading of the cam 312 into the opening 300 through the rear gap 506.

The cam 312 may be loaded into the opening 300 until the collar 800 engages the protrusion 404. For example, the cam 312 may be inserted into the housing 200 along the loading direction 900 until the collar 800 contacts or abuts the retention lip 408 of the resting surface 404. The rear gap 506 may be sufficiently small such that the collar 800 is unable to pass through the opening 300 and exit the housing 200 through the rear gap 506. In one embodiment, the height dimension 508 of the rear gap 506 may be smaller than the clearance dimension 724 of the collar 800 such that the collar 800 engages one or more of the retention lip 408, the resting surface 404, and the retention feature 322 and is prevented from exiting the opening 300 through the rear gap 506.

Figure 10:
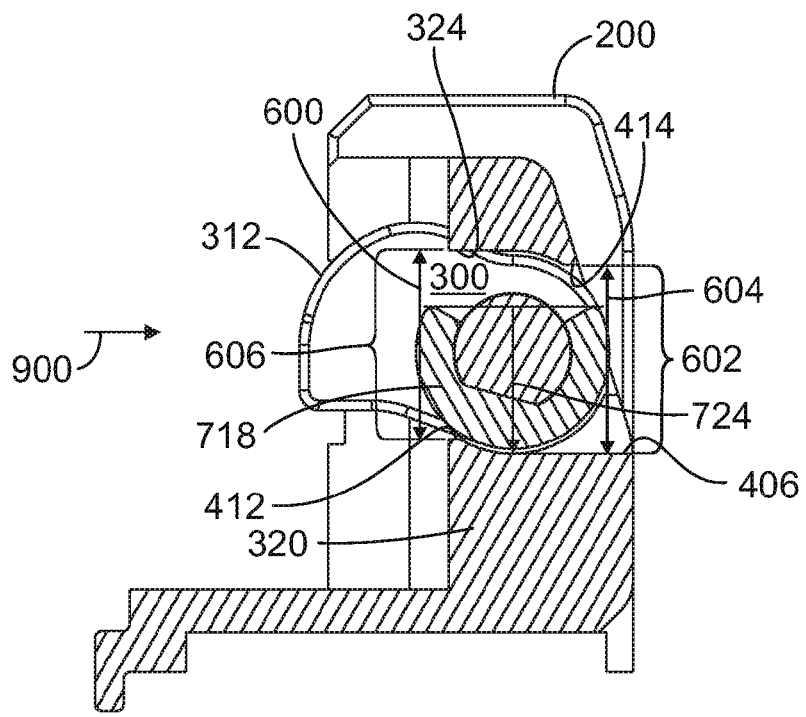
FIG. 10 is a cross-sectional view of the housing and the cam along line B-B shown in FIG. 4 when the cam is disposed in the engaged position shown in FIG. 9 in accordance with one embodiment of the present disclosure.

FIG. 10 is a cross-sectional view of the housing 200 and the cam 312 along line B-B shown in FIG. 4 when the cam 312 is disposed in the engaged position shown in FIG. 9 in accordance with one embodiment of the present disclosure. Similar to the collar 800 shown in FIG. 9, the clearance dimension 724 of the collar 718 is smaller than the height dimension 600 of the front gap 606 of the housing 200 between the retention feature 324 and the retention lip 412 of the resting surface 406. The cam 312 may be loaded into the opening 300 when the clearance dimension 724 of the collar 718 is aligned with the height dimension 600 between the retention lip 412 and the retention feature 324 because the clearance dimension 724 is smaller than the height dimension 600 and the collar 718 does not engage the retention feature 324, the retention lip 412, or the resting surface 406 of the retention feature 320. The cam 312 may be loaded into the opening 300 until the collar 718 engages the retention feature 324. For example, the cam 312 may be inserted into the housing 200 along the loading direction 900 until the collar 718 contacts or abuts the retention lip 414 of the retention feature 324. The rear gap 602 may be sufficiently small such that the collar 718 is unable to pass through the opening 300 and exit the housing 200 through the rear gap 506. The height dimension 604 of the rear gap 602 may be smaller than the clearance dimension 724 of the collar 718 such that the collar 718 engages one or more of the retention lip 414, the resting surface 406, and the retention feature 324 and is prevented from exiting the opening 300 through the rear gap 602. Alternatively, the rear gap 602 may be large enough to receive the cam 312. For example, the cam 312 may be loaded into the opening 300 through the rear gap 602. The clearance dimension 724 may be smaller than the height dimension 604 of the rear gap 602 to permit insertion of the cam 312 into the opening 300.

FIG. 11 is a cross-sectional view of the housing 200 and the cam 312 taken along line A-A shown in FIG. 4 when the cam 312 is disposed in a disengaged position in accordance with one embodiment of the present disclosure. The cross-sectional view shown in FIG. 11 illustrates the interaction between the housing 200 and the collar 800 of the cam 312 after the cam 312 is rotated downward from the engaged position shown in FIG. 9. For example, after the cam 312 is loaded into the opening 300 and disposed in the position shown in FIG. 9, the cam 312 may be rotated downward, or counter-clockwise from the perspective shown in FIG. 9 about the longitudinal axis 206 (shown in FIG. 2) until the lower portion 704 (shown in FIG. 7) of the cam 312 is disposed between the retention features 318, 320 (shown in FIG. 3) of the housing 200. The illustrated position also may be referred to as the disengaged position as this may be the same position to which the cam 312 is moved within the housing 200 in order to rotate the engagement surface 706 (shown in FIG. 7) away from the connector interface body 216 (shown in FIG. 2) and to move the connector interface body 216 toward the housing 200.

As shown in FIG. 11, the interference dimension 726 of the collar 800 is larger than the height dimension 500 of the front gap 502 of the housing 200. The collar 800 may be oriented in the position shown in FIG. 11 such that the interference dimension 726 is oriented approximately parallel to the height dimension 500 of the front gap 502. For example, after loading the cam 312 into the opening 300, the cam 312 may be rotated or positioned relative to the housing 200 such that the interference dimension 726 is parallel or approximately parallel to the height dimension 500 and the clearance dimension 724 is obliquely or perpendicularly oriented with respect to the height dimension 500. The housing 200 prevents removal of the cam 312 from the opening 300 when the cam 312 is in the illustrated position. For example, when the interference dimension 726 is aligned with the height dimension 500, the cam 312 is unable to be removed from the opening 300 through the front gap 502 as the height dimension 500 is smaller than the interference dimension 726. Movement of the cam 312 in a removal direction 1100 that is oriented opposite of the loading direction 900 (shown in FIG. 9) causes the housing 200 to engage the collar 800 across the interference dimension 726. For example, the retention feature 322 and/or the resting surface 404 may contact the collar 800. For example, the collar 800 may contact the retention lip 410 and be prevented from being removed from the opening 300 through the front gap 502.

The height dimension 508 of the rear gap 506 may be smaller than the interference dimension 726 to prevent removal of the cam 312 through the rear gap 506. For example, the height dimension 508 of the rear gap 506 may be sufficiently small such that the housing 200 engages the collar 800 at the rear gap 506 to prevent removal of the cam 312 from the opening 300 through the rear gap 506. The housing 200 may engage the collar 800 across the interference dimension 726 at the rear gap 506 of the housing 200. The collar 800 may abut the retention feature 322 and/or the retention lip 408 of the resting surface 404 to prevent removal of the cam 312 through the rear gap 506.

FIG. 12 is a cross-sectional view of the housing 200 and the cam 312 taken along line B-B of FIG. 4 when the cam 312 is disposed in the disengaged position shown in FIG. 11 in accordance with one embodiment of the present disclosure. Similar to the collar 800 shown in FIG. 11, the interference dimension 726 of the collar 718 is larger than height dimension 600 of the front gap 606 of the housing 200 between the retention feature 324 and the resting surface 404. For example, the distance between the retention lip 412 of the resting surface 406 and the retention feature 324 may be smaller than the interference dimension 726. Movement of the cam 312 in the removal direction 1100 causes the collar 718 to abut the retention lip 412 and/or the retention feature 324. The collar 718 abuts the retention lip 412 and/or retention feature 324 and is prevented from being removed from the opening 300 through the front gap 606.

The interference dimension 726 may be larger than the height dimension 604 of the rear gap 602 of the housing 200. The collar 718 abuts one or more of the retention lip 414 and the resting surface 406 and is prevented from being removed from the opening 300 through the rear gap 602.

Figure 13:
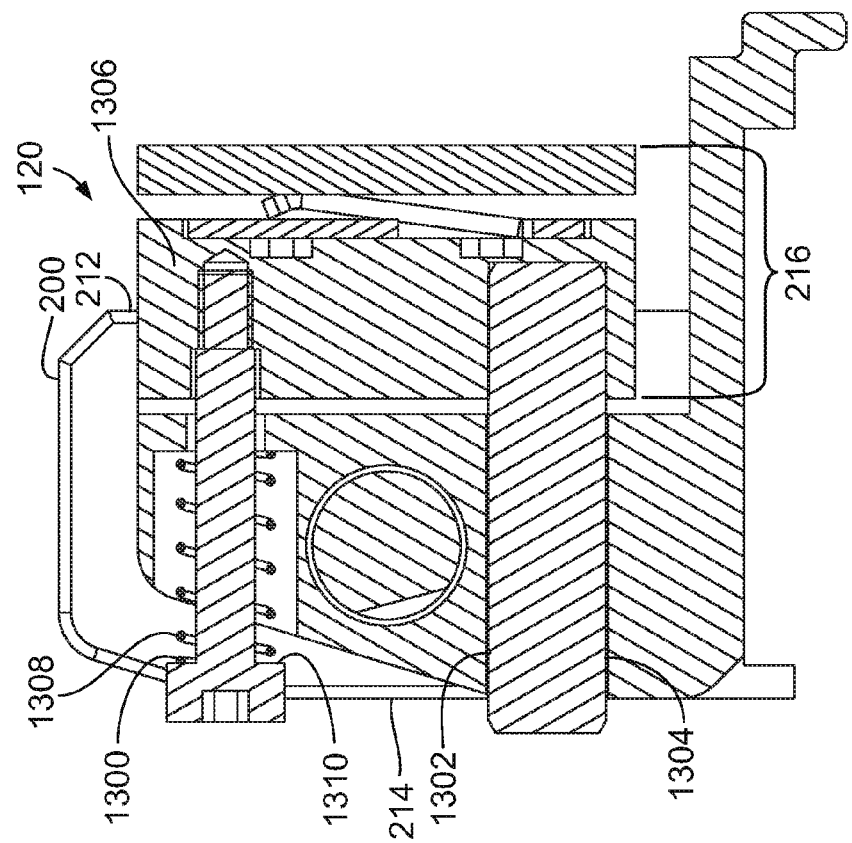
FIG. 13 is a cross-sectional view of the connector assembly along line 13-13 shown in FIG. 2 in accordance with one embodiment of the present disclosure.

FIG. 13 is a cross-sectional view of the connector assembly 120 taken along line 13-13 shown in FIG. 2 in accordance with one embodiment of the present disclosure. The connector assembly 120 includes several elongated bodies 1300 extending through transverse channels 1302 disposed in the housing 200. The bodies 1300 may be shoulder screws that include helical springs 1308 disposed around the bodies 1300. The transverse channels 1302 are elongated and extend through the housing 200 from the back side 214 to the front face 212. The bodies 1300 are received in cavities 1304 in the connector interface body 216. For example, the connector interface body 216 may include an engagement body 1306 disposed on a side of the connector interface body 216 that is opposite of the side that engages the circuit board 116 (shown in FIG. 1). The engagement body 1306 includes the cavities 1304 that receive the posts 1300. While only two bodies 1300, transverse channels 1302, and cavities 1304 are shown in FIG. 13, alternatively a different number of one or more of the bodies 1300, transverse channels 1302, and cavities 1304 may be provided.

The springs 1308 may extend between the connector interface body 216 and the housing 200. For example, opposite ends 1310, 1400 may be joined with the body 1300 and the engagement body 1306 of the connector interface body 216. The springs 1308 may be compression springs in one embodiment. The springs 1308 apply forces on the connector interface body 216 to pull the connector interface body 216 toward the front face 212 of the housing 200.

Figure 14:
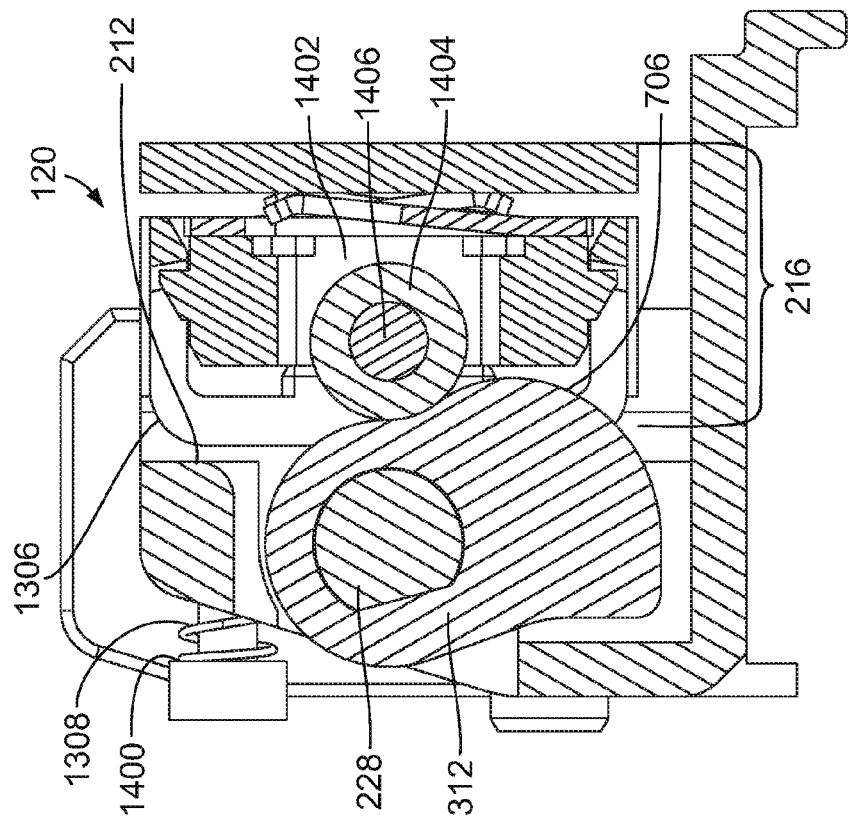
FIG. 14 is a cross-sectional view of the connector assembly along line 14-14 shown in FIG. 2 in accordance with one embodiment of the present disclosure.

FIG. 14 is a cross-sectional view of the connector assembly 120 along line 14-14 shown in FIG. 2 in accordance with one embodiment of the present disclosure. The engagement body 1306 includes a bearing cavity 1402 with a rotating bearing 1404 disposed therein. The rotating bearing 1404 is a tube or donut-shaped body that rotates about a post 1406. The post 1406 is joined with the engagement body 1306. The rotating bearing 1404 rotates around the post 1406 relative to the engagement body 1306. When the cam 312 is rotated from the disengaged position shown in FIG. 14 to the engaged position shown in FIG. 10, the engagement surface 706 of the cam 312 moves toward and engages the rotating bearing 1404. The rotating bearing 1404 is rotated about the post 1406 and along the engagement surface 706 as the cam 312 is rotated toward the connector interface body 216. As the cam 312 continues to be rotated toward the engaged position, the rotating bearing 1404 rotates about the post 1406 and moves along the cam 312. As the rotating bearing 1404 moves along the cam surface 706, the rotating bearing 1404, post 1406, and connector interface body 216 are driven away from the front face 212 of the housing 200.

The springs 1308 apply force to pull the connector interface body 216 toward the housing 200. When the cam 312 is moved from the engaged position shown in FIG. 10 to the disengaged position shown in FIG. 14, the springs 1308 pull the connector interface body 216 and the rotating bearing 1404 toward the housing 200. The force imparted by the springs 1308 may keep the cam 312 in the disengaged position shown in FIG. 14 when the shaft 228 and cam 312 are not rotated toward the engaged position. For example, when the operator releases the shaft 228 or rotates the shaft in the disengaged direction 316 (shown in FIG. 3), the springs 1308 may keep the cam 312 in the disengaged direction. As described above in connection with FIGS. 11 and 12, the collars 718, 800 (shown in FIGS. 7 and 8) of the cam 312 prevent removal of the cam 312 from the housing 200 when the cam 312 is in the disengaged position. As a result, the shaft 228 may be removed from the housing 200 when the cam 312 is in the disengaged position without removing the cam 312 from the housing 200. For example, the shaft 228 may be removed from the channel 220 (shown in FIG. 2) of the housing 200 without the cams 312 falling out or being removed from the housing 200. The engagement between the collars 718, 800 and the housing 220 retains the cams 312 within the housing 200 without the use or need for additional securing mechanisms, such as set screws and the like.

Figure 15:
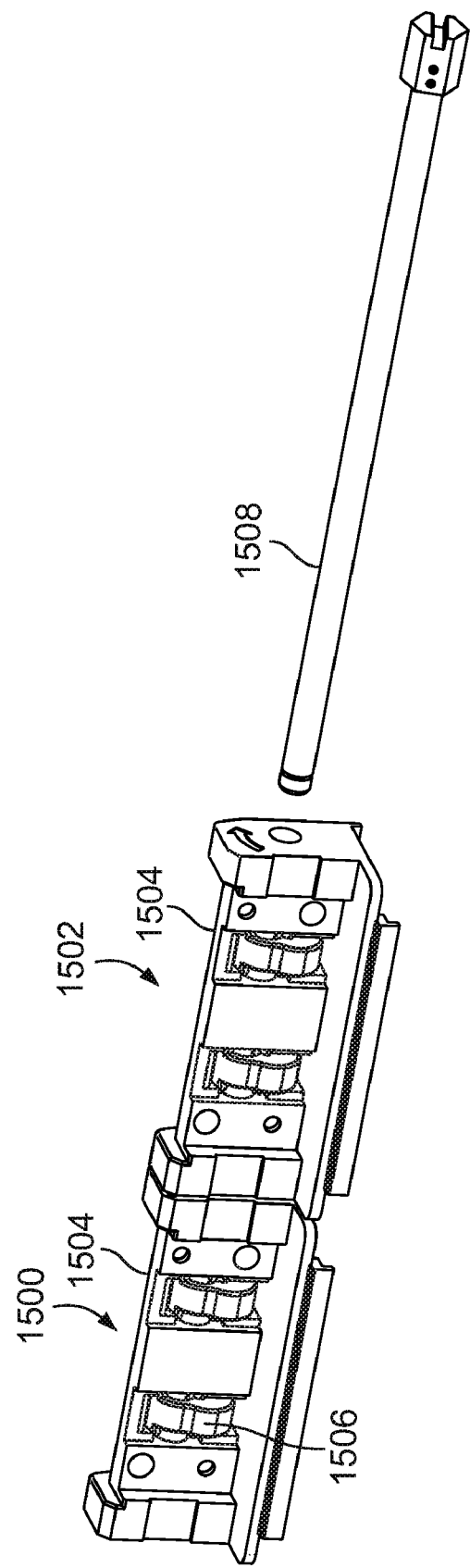
FIG. 15 is a perspective view of first and second connector assemblies in accordance with one embodiment of the present disclosure.

FIG. 15 is a perspective view of first and second connector assemblies 1500, 1502 in accordance with one embodiment of the present disclosure. Each of the connector assemblies 1500, 1502 may be similar to the connector assembly 120 (shown in FIG. 1). For example, each of the connector assemblies 1500, 1502 may include housings 1504 that are similar to the housing 200 (shown in FIG. 2) and cams 1506 that are similar to the cams 312 (shown in FIG. 3). Although not shown in FIG. 15, the connector assemblies 1500, 1502 may include connector interfaces that are similar to the connector interface body 216 (shown in FIG. 2). While only two connector assemblies 1500, 1502 are shown, alternatively a greater number of connector assemblies 1500, 1502 may be provided.

As described above, the shafts 228 (shown in FIG. 2) from each individual connector assembly 1500, 1502 may be removed by pulling the shafts 228 out of the housings 1504. The shafts 228 may include one or more retaining components (not shown) that retain the shafts 228 in the connector assemblies 1500, 1502. For example, clips such as c-clips may secure the shafts 228 in the connector assemblies 1500, 1502. The cams 1506 secure themselves within the housing 1504 such that the cams 1506 are not removed from the housing 1504 when the shafts 228 are removed from the housings 1504. Additionally, the cams 1506 may not be affixed to the shafts 228 using additional fastening mechanisms. A longer shaft 1508 may be loaded into the housings 1504 as shown in FIG. 15. For example, a shaft 1508 that is long enough to extend through both housings 1504 may be loaded into the housings 1504. As the cams 1506 remain in the housings 1504 after removal of the previous shafts 228 and remain in the disengaged positions, the shaft 1508 may be loaded into the housings 1504 without separately attaching or affixing the cams 1506 to the shaft 1508. Once the shaft 1508 is placed into the housings 1504, the shaft 1508 may be rotated to simultaneously or concurrently rotate the cams 1506 from the disengaged positions shown in FIG. 15 to the engaged positions shown and described above.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
   a housing extending between opposite ends along a longitudinal axis and including a front face, the housing including an opening extending into the front face and an elongated channel oriented along the longitudinal axis, the housing including retention features extending into the opening;
   a connector interface body joined with the front face of the housing, the connector interface body configured to move away from the front face to mate with a circuit board;
   an elongated shaft disposed in the channel and configured to rotate within the housing; and
   a cam disposed within the opening of the housing and including a passageway through which the shaft extends such that rotation of the shaft rotates the cam to engage and drive the connector interface body away from the housing, the cam including a collar protruding from the cam and extending along a periphery of the passageway, wherein the collar has a clearance dimension along a first direction that is smaller than a gap between the retention features of the housing and an interference dimension along a transverse direction that is larger than the gap, the cam configured to be retained in the housing when the collar engages the retention features across the interference dimension.

2. The connector assembly of claim 1, wherein the shaft is configured to be removable from the channel while the cam engages the retention features of the housing and is retained within the housing.

3. The connector assembly of claim 1, wherein the gap between the retention features has a height dimension oriented parallel to a vertical axis of the housing, the housing permitting insertion of the cam into the opening when the clearance dimension is oriented parallel to the height dimension of the gap.

4. The connector assembly of claim 1, wherein the cam is configured to be rotatable within the housing from a first position where the cam engages and moves the connector interface body away from the housing and a second position where the cam disengages the connector interface body, and the interference dimension of the collar is oriented parallel to a height dimension of the gap when the cam is in the first position.

5. The connector assembly of claim 1, wherein the cam is configured to be rotatable within the housing from a first position where the cam engages and moves the connector interface body away from the housing and a second position where the cam disengages the connector interface body, the clearance dimension of the collar is obliquely oriented with respect to a height dimension of the gap when the cam is in the second position.

6. The connector assembly of claim 1, wherein the housing is a first housing, the connector interface body is a first connector interface body, and the cam is a first cam, further comprising a second housing, a second connector interface body, and a second cam, the shaft extending through the channels of the first and second housing and removable from the channels while the first and second cams engage the first and second housings, respectively, across the interference dimensions of the collars to retain the first and second cams in the first and second housings when the shaft is removed.

7. The connector assembly of claim 1, wherein the retention features of the housing include a ledge extending into the opening in a direction parallel to the longitudinal axis upon which the collar of the cam slides when the cam is rotated within the housing.

8. The connector assembly of claim 1, wherein the retention features of the housing are a first set of retention features and the collar is a first collar, further comprising a second set of retention features and a second collar, the first and second sets of retention features extending into the opening of the housing in opposing directions, the first and second collars protruding from the cam in opposite directions, the first collar engaging the first set of retention features and the second collar engaging the second set of retention features.

9. The connector assembly of claim 1, wherein the cam includes an oblong body with the passageway being an off-center opening extending through the body.

10. The connector assembly of claim 1, wherein a first one of the retention features includes a ledge extending into the opening in a direction parallel to the longitudinal axis and protruding toward a second one of the retention features, the collar configured to be secured in the housing when the collar engages the retention lip and the second one of the retention features when the interference dimension is oriented parallel to a height dimension of the gap.

11. The connector assembly of claim 1, wherein the collar has an arcuate shape that extends around a portion of the periphery of the passageway in the cam between opposite ends.

12. A connector assembly comprising:
   a housing extending between opposite ends along a longitudinal axis and including a front face, the housing including an opening extending into the front face and an elongated channel oriented along the longitudinal axis, the housing including retention elements disposed within the opening;
   a connector interface body joined with the front face of the housing, the connector interface body configured to move away from the front face to mate with a circuit board;
   an elongated shaft disposed in the channel and configured to rotate within the housing; and a cam disposed within the opening of the housing and including a passageway through which the shaft extends such that rotation of the shaft rotates the cam to engage and drive the connector interface body away from the housing, the cam including a collar protruding from the cam and extending along a periphery of the passageway, the collar having a clearance dimension along a first direction that is smaller than a height dimension of a gap between the retention features of the housing and an interference dimension along a transverse direction that is larger than the height dimension, wherein the cam is configured to be retained in the housing when the shaft is removed from the channel by the cam engaging the retention features across the interference dimension of the collar.

13. The connector assembly of claim 12, wherein the retention features protrude from a common inner surface of the housing.

14. The connector assembly of claim 12, wherein the housing is configured to permit insertion of the cam into the opening when the clearance dimension is oriented parallel to the height dimension of the gap.

15. The connector assembly of claim 12, wherein the cam is configured to be rotatable within the housing from an engaged position where the cam engages and moves the connector interface body away from the housing and a disengaged position where the cam disengages the connector interface body, and the interference dimension of the collar is oriented parallel to the height dimension of the gap when the cam is in the engaged position.

16. The connector assembly of claim 12, wherein the cam is configured to be rotatable within the housing from an engaged position where the cam engages and moves the connector interface body away from the housing and a disengaged position where the cam disengages the connector interface body, the clearance dimension of the collar is aligned with the height dimension of the gap when the cam is in the disengaged position.

17. The connector assembly of claim 12, wherein the housing is a first housing, the connector interface body is a first connector interface body, and the cam is a first cam, further comprising a second housing, a second connector interface body, and a second cam, the shaft extending through the channels of the first and second housing and is configured to be removable from the channels while the first and second cams are retained in the first and second housings by engaging the first and second housings, respectively, across the interference dimensions of the collars.

18. The connector assembly of claim 12, wherein the retention features of the housing include a ledge extending into the opening in a direction parallel to the longitudinal axis, the ledge including a resting surface upon which the collar of the cam is configured to slide when the cam is rotated within the housing.

19. The connector assembly of claim 12, wherein the retention features of the housing are a first set of retention features and the collar is a first collar, further comprising a second set of retention features and a second collar, the first and second sets of retention features extending into the opening of the housing toward each other, the first and second collars protruding from the cam in opposite directions, the first collar engaging the first set of retention features and the second collar engaging the second set of retention features.

20. The connector assembly of claim 12, wherein a first one of the retention features includes a ledge extending into the opening in a direction parallel to the longitudinal axis and a retention lip protruding from the at least one of the upper surface and the ledge toward a second one of the retention features, the collar configured to be retained in the housing by engaging the retention lip and the second one of the retention features across the interference dimension of the collar.

* * * * *